United States Patent
Noh et al.

(10) Patent No.: US 12,332,746 B2
(45) Date of Patent: Jun. 17, 2025

(54) METHOD OF RESTORING DATA AND MEMORY OF PERFORMING THE SAME

(71) Applicant: NETSOL CO., LTD, Hwaseong-si (KR)

(72) Inventors: Yong Hwan Noh, Hwaseong-si (KR); Seung Min Lee, Suwon-si (KR); Dong Min Kim, Suwon-si (KR); Hyo Chang Kim, Seongnam-si (KR)

(73) Assignee: NETSOL CO., LTD (KR)

( * ) Notice: Subject to any disclaimer, the term of this patent is extended or adjusted under 35 U.S.C. 154(b) by 0 days.

(21) Appl. No.: 18/283,194

(22) PCT Filed: Nov. 28, 2022

(86) PCT No.: PCT/KR2022/018945
§ 371 (c)(1),
(2) Date: Sep. 20, 2023

(87) PCT Pub. No.: WO2024/111721
PCT Pub. Date: May 30, 2024

(65) Prior Publication Data
US 2025/0036529 A1  Jan. 30, 2025

(30) Foreign Application Priority Data
Nov. 23, 2022 (KR) .................. 10-2022-0158150

(51) Int. Cl.
*G06F 12/00* (2006.01)
*G06F 11/14* (2006.01)

(52) U.S. Cl.
CPC ........................ *G06F 11/1448* (2013.01)

(58) Field of Classification Search
CPC .. G06F 11/1448; G06F 13/14; G06F 13/1668; G06F 11/08
See application file for complete search history.

(56) References Cited

U.S. PATENT DOCUMENTS

| | | | |
|---|---|---|---|
| 5,134,616 A | 7/1992 | Barth, Jr. et al. | |
| 5,933,436 A | 8/1999 | Tanzawa et al. | |
| 2009/0103356 A1 | 4/2009 | Mokhlesi | |
| 2018/0341580 A1* | 11/2018 | Miao ................... | G06F 12/0253 |

FOREIGN PATENT DOCUMENTS

| | | |
|---|---|---|
| JP | 4627411 B2 | 2/2011 |
| KR | 20140062332 A | 5/2014 |

* cited by examiner

*Primary Examiner* — Shawn X Gu
(74) *Attorney, Agent, or Firm* — Renaissance IP Law Group LLP

(57) ABSTRACT

A method for restoring data and a non-volatile memory performing the restore operation are disclosed. If a restore command is applied, an internal read command is generated to sequentially designate the addresses. A read operation is performed on the designated address, and the number of error bits in a code word is compared with a reference number of error bits. Depending on the result of the comparison, an update or restore operation on a corrected code word for the designated address is selectively performed.

15 Claims, 6 Drawing Sheets

METHOD OF RESTORING DATA AND MEMORY OF PERFORMING THE SAME

TECHNICAL FIELD

The present inventive concept relates to an operating method of a non-volatile memory, and more particularly, to a method for restoring data with high reliability and a memory implementing the method for restoring data.

BACKGROUND ART

Non-volatile memory is a type of memory that uses changes in resistance or changes in threshold voltage, and it is classified into various types based on the type of material that induces changes in resistance and the mechanism that causes changes in resistance. For example, MRAM stores data using changes in magnetization of ferromagnetic materials.

Non-volatile memory is required to operate normally even with a large number of read and write operations and it must possess a high data retention capability for a long time. However, various types of non-volatile memories have issues with errors occurring in stored data due to their inherent technical limitations.

That is, errors can occur in the read operation due to the data written in the memory cell being flipped or having different levels. These data errors in the memory act as a significant vulnerability to the reliability of the memory.

For example, in MRAM, data errors occur due to various reasons. Due to the fast operation speed during the write operation, the time allotted for the write operation is reduced, and due to the write current applied for a short period of time, the magnetization in the free layer may not change sufficiently. Another example of errors is the possibility of data inversion (flip) where the magnetization of the free layer can change due to the read current passing through the pinned layer and the free layer during the read operation. Another example of data errors in MRAM is the phenomenon where data is flipped due to an increased temperature of the memory chip or an external magnetic field. The occurrence of data errors in the non-volatile memory is not limited to MRAM, and it also occurs in various other types of non-volatile memories due to a range of causes.

An error correction code engine is used to address the above-mentioned issues associated with data errors. The error correction code engine has an error correction capability determined by a designer or a user, and it corrects errors in data within the range of the error correction capability. The error correction capability refers to the maximum number of error bits that can be corrected within the data. A higher error correction capability results in improved reliability of the data stored in and retrieved from the memory.

However, if the error correction capability is increased to improve the reliability of data, the number of parity bits should be increased. The parity forms a code word together with data, which increases the number of bits of the code word, resulting in an increased chip area. Accordingly, a memory designer selects an error correction capability by determining an appropriate number of parity bits depending on the type of memory and the desired level of data reliability.

Moreover, in the non-volatile memory, the probability of data loss increases over time due to external factors such as temperature variations or magnetic fields. This phenomenon occurs due to continuous use of memory, and it leads to error bits that exceed the set error correction capability. Due to the overflow phenomenon of these errors, the error correction code engine introduced within the non-volatile memory fails to perform proper error correction. As a result, data with errors is output during the read operation on the memory, leading to defects in the read operation.

DISCLOSURE

Technical Problem

A first object to be solved by the present inventive concept is to provide a method for restoring data in a memory, which can update information stored in the memory by sequentially designating a plurality of addresses by a restore command.

Moreover, a second technical problem to be solved by the present inventive concept is to provide a non-volatile memory for solving the first technical problem.

Technical Solution

The present inventive concept for solving the first technical problem provides a method for restoring data in a memory, comprising: generating a designated address in response to a restore command; performing a read operation on a code word having data and parity from cells of the designated address; comparing the number of error bits in the code word with a reference number of error bits; and performing a selective write operation on the designated address depending on the result of the comparison.

The present inventive concept for solving the second technical problem provides a non-volatile memory comprising: a cell array with a plurality of cells disposed therein; an access unit that accesses the cell array to write or output a code word consisting of data and parity in or to cells assigned to a designated address; a read path that is connected to the access unit to generate corrected data by performing error correction on the data output from the cells in response to an internal read command and to generate the number of error bits in the code word using the parity; a restore controller that receives the number of error bits from the read path and compares the number of error bits with a reference number of error bits to generate the internal read command or generate an update write command for a selective write operation in the cell array; a write path that is connected to the access unit and disposed in parallel with the read path to selectively receive the corrected data in response to the update write command and generate a corrected parity to output a corrected code word to the access unit; and an address generator that receives the internal read command from the restore controller to generate the designated address.

Advantageous Effects

According to the present inventive concept as described above, when the restore command is applied, the designated addresses are sequentially generated, and the read operation and the comparison operation are performed on the generated designated addresses. The comparison operation is the process of comparing the number of error bits in the code word of the designated address with the reference number of error bits. As a result of the comparison, the code word having the number of error bits that is greater than or equal to the reference number of error bits is updated and rewritten in the designated address through the write path. This process allows for the restore operation on the memory cell.

Moreover, the write operation is not performed on the code word having error bits less than the reference number of error bits in the sequentially generated designated addresses. Thus, the restore operation on the memory can be effectively performed.

BEST MODE FOR CARRYING OUT THE INVENTION

Figure 1:
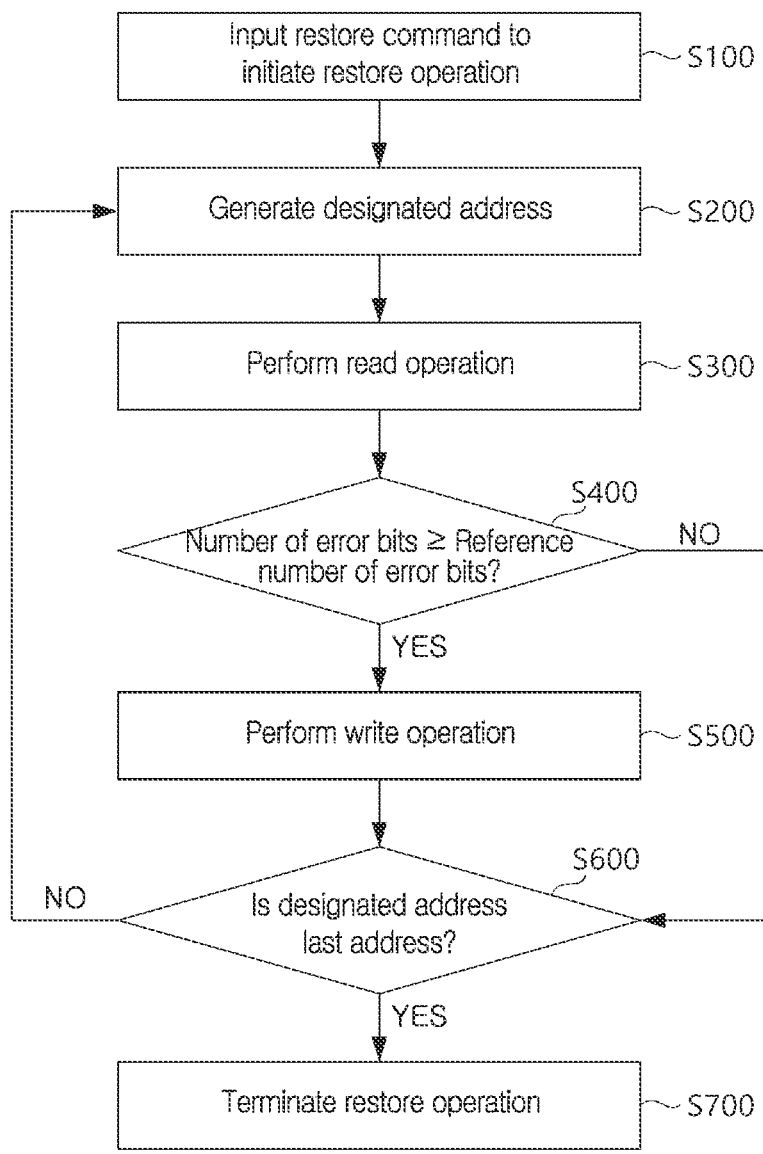
FIG. 1 is a flowchart illustrating a method for restoring data in a memory according to a preferred embodiment of the present inventive concept.

As the present inventive concept allows for various changes and numerous embodiments, particular embodiments will be illustrated in the drawings and described in detail in the written description. However, this is not intended to limit the present inventive concept to particular modes of practice, and it is to be appreciated that all changes, equivalents, and substitutes that do not depart from the spirit and technical scope of the present inventive concept are encompassed in the present inventive concept. In the drawings, like reference numerals have been used throughout to designate like elements.

Unless defined otherwise, all terms used herein including technical or scientific terms have the same meaning as those generally understood by those skilled in the art to which the present inventive concept pertains. It will be further understood that terms defined in dictionaries that are commonly used should be interpreted as having meanings that are consistent with their meanings in the context of the relevant art and should not be interpreted as having ideal or excessively formal meanings unless clearly defined in the present application.

Hereinafter, preferred embodiments of the present inventive concept will be described in more detail with reference to the accompanying drawings.

Embodiments

FIG. 1 is a flowchart illustrating a method for restoring data in a memory according to a preferred embodiment of the present inventive concept.

Referring to FIG. 1, a restore command is input to a memory to initiate a restore operation (S100). If the restore command is activated, an internal read command PREAD is generated, and internal addresses may be sequentially generated by the internal read command PREAD.

The term "activation" as used herein refers to the state in which the corresponding circuit or block can process an input signal or data, indicating that the circuit or block is in its normal operating state.

If the restore command is activated, the operation of generating a designated address is performed (S200). In this embodiment, the designated address refers to an address to be restored. If the restore operation or read operation is completed, the designated address is replaced with a new address.

If the restore command is applied, a start address that is the first address for the restore operation is generated. The generation of the start address may be implemented through a specific algorithm within the memory, or may be applied from the outside of the memory.

Furthermore, if the restore operation or read operation on the start address is completed, a new address is designated. That is, the addresses may be sequentially generated in a time-series manner. The generation of addresses is performed by the internal read command PREAD, and this internal read command PREAD may have different operation periods depending on the features of the restore operation. The operation period of the internal read command PREAD refers to a period during which the generated address is supplied to the access unit.

Depending on the features of the restore operation on the memory, both the read operation and the write operation may be performed, or only the read operation may be performed. When both the read operation and the write operation are performed, the corresponding designated address is maintained for a relatively long period of time, and when only the read operation is performed, the corresponding designated address is maintained for a relatively short period of time.

The code word of the cells assigned to the address become accessible by the generation of the address. The code word consists data and parity, where the data refers to the information that a user inputs to or outputs from the memory, and the parity is the information used to correct errors in the data stored in the memory and generated within the memory corresponding to the data.

If the operation of generating the designated address is performed, the read operation is performed (S300). The read operation on the code word of the cells corresponding to the designated address is performed by the generated internal read command PREAD. During the read operation, an error correction decoding operation is performed. Corrected data in which data errors are corrected by the error correction decoding operation is generated, and the number of error bits of the code word is also generated.

The number of error bits output from the read path is compared with a reference number of error bits (S400). Preferably, the reference number of error bits is set to 1 or to be less than or equal to an error correction capability. The error correction capability refers to the maximum number of error bits that can be corrected by the parity of the code word.

A memory designer can also determine the reference number of error bits depending on the intended use of the memory. That is, the reference number of error bits may be input through an external terminal of the memory and used for the comparison with the number of error bits. Depending on the embodiment, the reference number of error bits may also be set to a fixed value within the memory by the designer.

The time at which a new internal read command PREAD is activated may vary depending on the comparison with the number of error bits. The generation of a new address and the read operation on a new code word of the cells assigned to the new address may be performed by the new internal read command PREAD.

If the number of error bits is greater than or equal to the reference number of error bits, the write operation is performed (S500). The activation of the write path for the write operation is performed by an update write command PWRITE. That is, the write path is activated by the update write command PWRITE.

The activated write path selects corrected data and performs an error correction encoding operation on the corrected data. The error correction encoding operation is the process of generating a corrected parity that is a new parity based on the corrected data, and the corrected parity is combined with the corrected data to generate a corrected code word. The corrected code word is written in the cells of the designated address. This process allows for the restore operation of updating the code word.

If the number of error bits is less than the reference number of error bits, the activation of the write path does not occur.

After the write operation on the corrected code word or if the number of error bits is less than the reference number of error bits, it is determined whether the designated address is the last address (S600).

If the designated address is not the last address, a new address is generated, and the generated new address becomes the designated address of step S200, and the above-mentioned steps S200 to S600 are performed.

The above-described process is performed until the designated address used for the read operation and the restore operation corresponds to the last address. In the restore operation including the read operation or the write operation, a plurality of addresses are sequentially generated from the start address.

If the designated address is the last address, the restore operation is terminated (S700).

Figure 2:
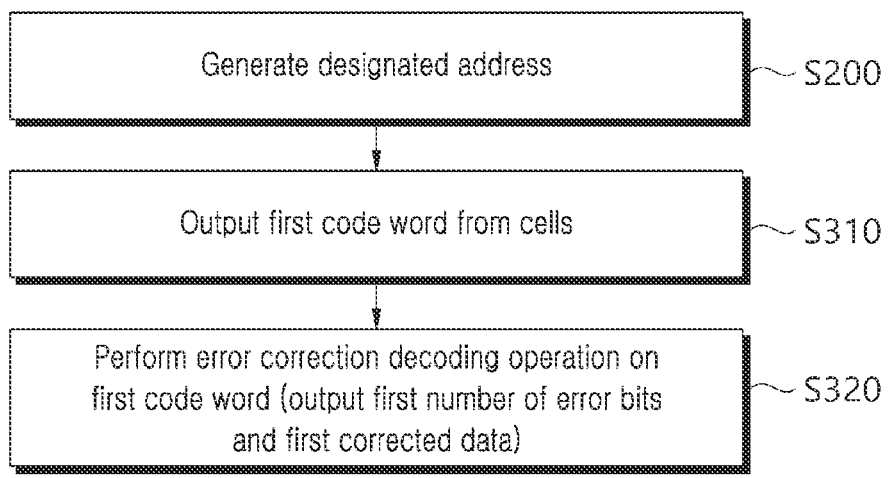
FIG. 2 is a flowchart illustrating the operations of generating and reading a designated address of FIG. 1 according to a preferred embodiment of the present inventive concept.

FIG. 2 is a flowchart illustrating the operations of generating and reading the designated address of FIG. 1 according to a preferred embodiment of the present inventive concept.

Referring to FIG. 2, if the internal read command is activated, the designated address is generated (S200). The designated address may be a start address, and may be a newly generated address after the steps of FIG. 1 for the start address have been performed.

Subsequently, a first code word is output from the cells to the read path by the read operation on the designated address (S310). The first code word has first data and a first parity. If the read path is activated by the activated internal read command PREAD, the read operation is performed on the cells of the designated address. In FIG. 2, the code word stored in the cells of the designated address is referred to as the first code word.

Then, the error correction decoding operation is performed on the first code word assigned to the first address (S320). The error correction decoding operation corresponds to a logical operation, and the number of error bits having errors is also determined in the error correction operation using the parity. First corrected data and a first number of error bits are generated by the error correction decoding operation. The first corrected data is generated by the correction of the first data, and the first number of error bits refers to the number of error bits in the first code word consisting of the first data and the first parity.

Figure 3:
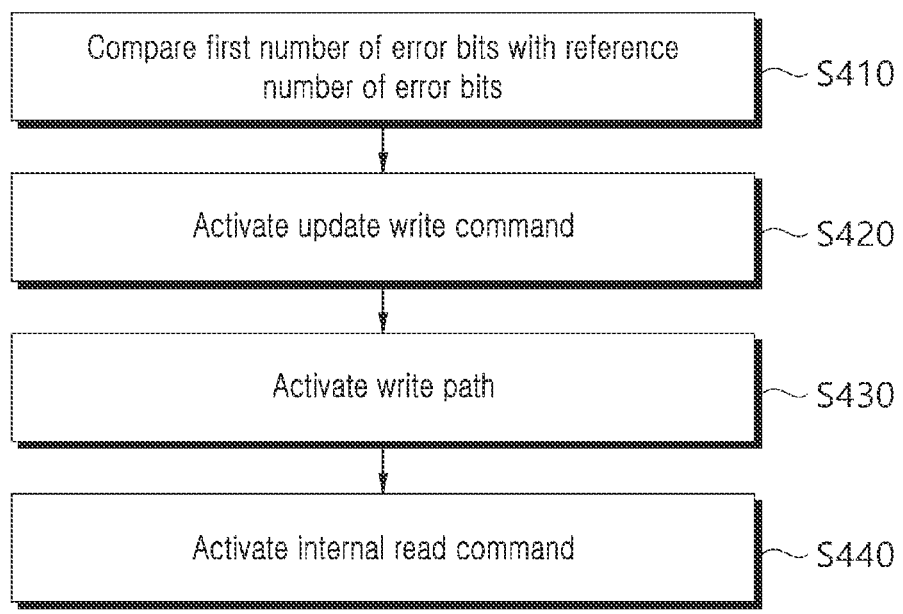
FIG. 3 is a flowchart illustrating the operation of comparing the number of error bits of FIG. 1 according to a preferred embodiment of the present inventive concept.

FIG. 3 is a flowchart illustrating the operation of comparing the number of error bits of FIG. 1 according to a preferred embodiment of the present inventive concept.

Referring to FIG. 3, the first number of error bits is received, and the first number of error bits is compared with the reference number of error bits (S410). The reference number of error bits may be a value preset in the memory or may be a value input from an external terminal of the memory.

If the first number of error bits is greater than or equal to the reference number of error bits, the update write command PWRITE is activated (S420). The reference number of error bits is interpreted as a basis for determining the update operation on data in the memory. That is, in the event of a data error that is less than the reference number of error bits, the error of the first code word can be ignored; however, in the event of an error that is greater than or equal to the reference number of error bits, the error of the first data should be corrected, and the corrected data should be rewritten to the cells of the first address.

The write path is activated by the generated update write command PWRITE (S430). If the write path is activated, the write path selects the first corrected data.

If the number of error bits is less than the reference number of error bits, the update write command PWRITE is deactivated or not generated, and the write path is also deactivated.

After the update write command PWRITE is activated, the internal read command PREAD is activated (S440). The internal read command PREAD is used for the generation of a new address and the read operation on another code word assigned to the new address. The reason why the internal read command PREAD follows the update write command PWRITE is to ensure that the read operation on the new address is performed through the read path during the process where the first corrected data is input to the write path and the write operation is performed. This improves the speed of data restore operation.

Figure 4:
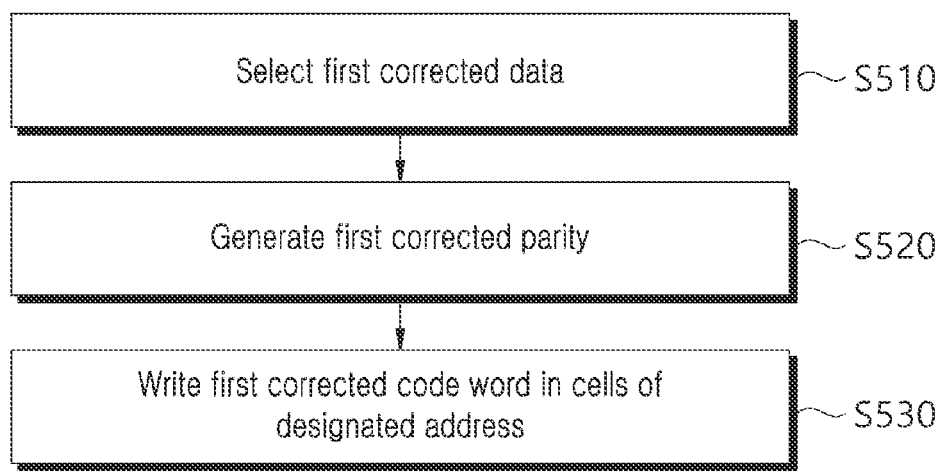
FIG. 4 is a flowchart illustrating the write operation of FIG. 1 according to a preferred embodiment of the present inventive concept.

FIG. 4 is a flowchart illustrating the write operation of FIG. 1 according to a preferred embodiment of the present inventive concept.

Referring to FIG. 4, the activated update write command PWRITE is input to the write path, and the write path selects the first corrected data generated in the read path (S510).

To the write path, input data for the write operation may be applied from the outside of the memory, or the first corrected data may be applied from the read path simultaneously with the application of the input data. This occurs when there is a collision between the update write command generated within the memory and the write command generated from the outside of the memory. In the event of a collision between these two commands, the update write command takes precedence, causing the write path to select the first corrected data instead of the input data.

The error correction encoding operation is performed on the selected first corrected data, and a first corrected parity corresponding to the first corrected data is generated (S520).

The newly formed first corrected parity and the first corrected data form a first corrected code word, and the first corrected code word is written in the cells of the designated address (S530). This process allows for the restore operation on the code word assigned to the designated address.

Figure 5:
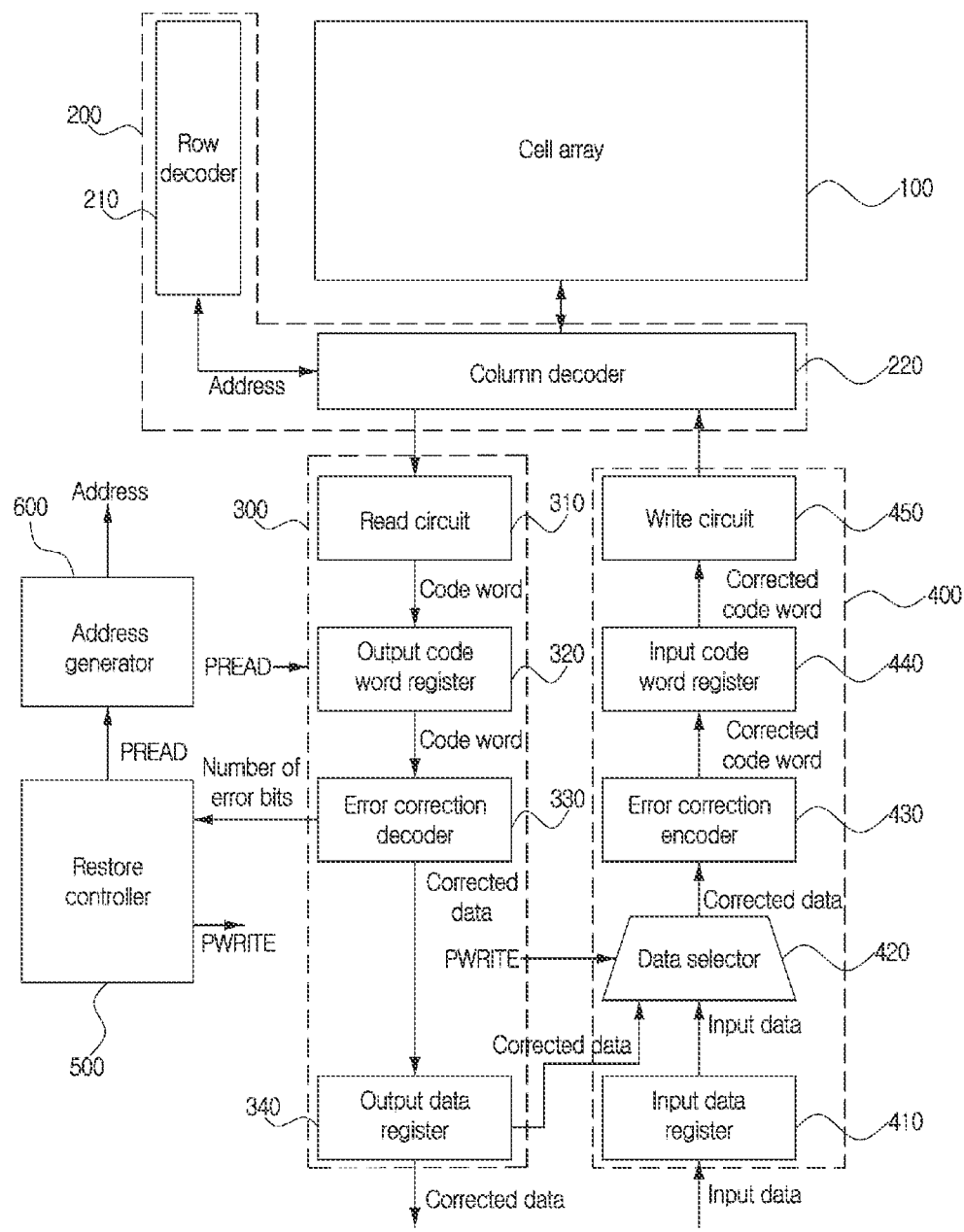
FIG. 5 is a block diagram of a memory according to a preferred embodiment of the present inventive concept.

FIG. 5 is a block diagram of a memory according to a preferred embodiment of the present inventive concept;

Referring to FIG. 5, the memory of this embodiment has a cell array 100, an access unit 200, a read path 300, a write path 400, a restore controller 500 and an address generator 600.

The cell array 100 has a cell as a unit storage element, a word line, and a column line. The word line and the column line are connected to the cell.

Depending on the type of cell, the column line may have a data line and a source line. For example, the word line may be used to select a cell, and the column line may be used to apply data to the cell to perform the read operation or the write operation. The cells are preferably in the form of a matrix arranged in an organized manner.

The access unit 200 has a row decoder 210 and a column decoder 220. A plurality of word lines may be connected to the row decoder 210 to select cells of a specific row line. Moreover, the column decoder 220 applies a write signal or a read signal to a specific column line.

The row line selected by the row decoder 210 and the column line selected by the column decoder 220 are determined by the designated address applied. However, the operation of selecting the cells performed by the access unit 200 is not a critical element of the present inventive concept, and thus a detailed description thereof will be omitted.

The read path 300 has a read circuit 310, an output code word register 320, an error correction decoder 330, and an output data register 340. The read path 300 receives the code word output through the access unit 200, amplifies the received code word, and then performs the error correction decoding operation. As described above with reference to FIGS. 1 to 4, the corrected data and the number of error bits are output from the read path 300.

The read circuit 310 receives the code word output from the column decoder 220 and amplifies the received code word to a level suitable for digital signal processing. The code word is a code word stored in the cells corresponding to the designated address applied to the access unit 200. The read circuit 310 has a sense amplifier, and the code word amplified by the sense amplifier is stored in the output code word register 320.

The output code word register 320 outputs the code word to the error correction decoder 330 in synchronization with an internal clock signal. The output code word register 320 is not an essential element of the read path 300, but it offers the advantage of facilitating the data processing when the code word is processed according to the internal clock signal. The code word consists of data and parity. For example, the data may have k bits (where k is a natural number greater than or equal to 1), the parity may have p bits (where p is a natural number greater than or equal to 1), and thus the code word may have k+p bits.

The error correction decoder 330 receives the code word of the output code word register 320 and performs the error correction operation on the data using the parity. In this embodiment, the data refers to binary data having information desired by a user in the read and write operations and output from or input to the memory. Moreover, the parity, as is commonly known to those skilled in the art, is an error identifier added to the data to detect errors in the data.

For setting the parity, conventional techniques well known to those skilled in the art are employed. For example, if the data is 32 bits, the parity may consist of 12 bits, and various types of parity may be set based on the data error correction method and the error correction capability. However, the method of setting the parity is not a critical element of the present inventive concept, and conventional methods commonly used in the art are employed.

The parity may be used not only to correct errors in the data through the error correction decoding operation, but also to determine the number of error bits in the code word through the digital processing using the parity. That is, the number of error bits of the code word can be determined using the parity. In the error correction decoder 330, the corrected data in which data errors are corrected is generated, and the number of error bits is also generated.

The corrected data is input to the output data register 340, and the output data register 340 outputs the corrected data. If there are no errors in the data, the corrected data and the data stored in the cell array will be the same; however, if there are errors in the data, the corrected data and the data stored in the cell array will have different values.

The number of error bits output from the error correction decoder 330 is input to the restore controller 500. The restore controller 500 receives a restore command and generates an internal read command PREAD and an update write command PWRITE.

The read path 300 is activated by the internal read command PREAD activated by the restore command, and the internal read command PREAD is also input to the address generator 600, causing the designated addresses to be sequentially generated.

The address generator 600 receives the internal read command PREAD and sequentially generates a plurality of designated addresses. For the generation of designated addresses, a start address and an end address need to be set. These addresses may be preset in the address generator 600 or may be applied through an external input terminal of the memory.

The read operation on the cell array is performed by the designated addresses generated by the address generator 600. Accordingly, the restore command precedes the internal read command PREAD, and the internal read command PREAD precedes the error correction decoding operation of the read path 300.

The number of error bits input to the restore controller 500 is compared with the reference number of error bits. The reference number of error bits is set less than or equal to the maximum number of error bits. The maximum number of error bits refers to the maximum number of error bits of data that can be corrected by the parity set in the memory. This needs to be understood as the maximum correction capability of the parity.

If the number of error bits is less than the reference number of error bits, the update write command PWRITE is not generated or activated. Accordingly, the write path 400 either receives only the input data or maintains an inactive state. If the number of error bits is greater than or equal to the reference number of error bits, the restore controller 500 activates the update write command PWRITE. The write path 400 is activated by the activated update write command PWRITE, and the write path 400 selects the corrected data.

The write path 400 has an input data register 410, a data selector 420, an error correction encoder 430, an input code word register 440 and a write circuit 450.

The write path 400 may receive input data through the input data register 410 in response to a write command applied from the outside of the memory and generate an input parity corresponding to the received input data. Moreover, the write path 400 may receive an update write command PWRITE from the restore controller 500 to select the corrected data and generate a corrected parity corresponding to the corrected data.

If the write command and the update write command PWRITE are conflicted within the same period, the write path 400 preferentially selects the update write command PWRITE. If the write path 400 selects the corrected data, the write path 400 generates the corrected parity corresponding to the corrected data and combines them to output a corrected code word to the column decoder 220.

For the above-described operation, the update write command PWRITE is applied to the data selector 420 of the write path 400. If the update write command PWRITE is activated, the data selector 420 receives the corrected data from the output data register 340. Depending on the embodiment, the data selector 420 may directly receive the corrected data from the error correction decoder 330.

The error correction encoder 430 receiving the corrected data from the data selector 420 generates a corrected parity corresponding to the corrected data. The corrected parity forms the corrected code word along with the corrected data.

The corrected code word is stored in the input code word register 440 and supplied to the write circuit 450 in synchronization with the internal clock signal. The input code word register 440 is not an essential element of the write path 400, but it offers the advantage of facilitating the data processing when the code word is processed according to the internal clock signal.

The corrected code word is applied to the column decoder 220 via the write circuit 450. Through the initial read operation, the corrected code word is written in the cells corresponding to the designated address. This process allows for the correction of the errors in the code word stored in a single address and the restore operation on the code word.

Figure 6:
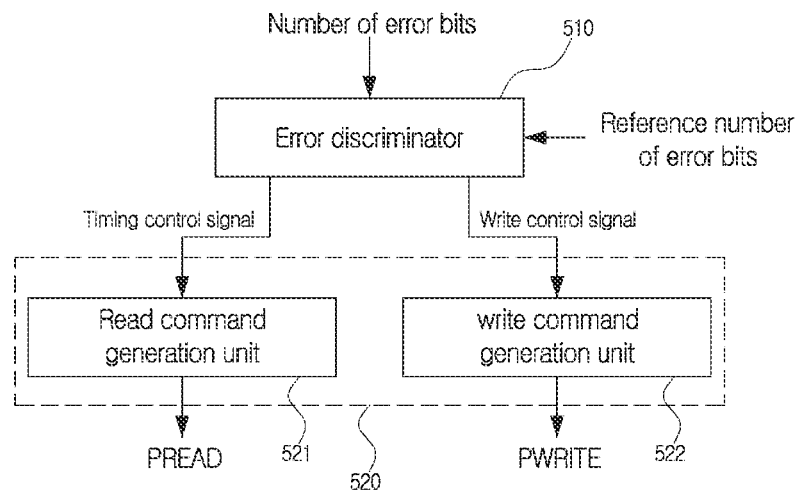
FIG. 6 is a block diagram illustrating a restore controller of FIG. 5 according to a preferred embodiment of the present inventive concept.

FIG. 6 is a block diagram illustrating the restore controller of FIG. 5 according to a preferred embodiment of the present inventive concept.

Referring to FIG. 6, the restore command is input to the restore controller, and the restore controller is activated to start the operation. An internal read command PREAD for the generation of an initial address may be generated by the restore command. Moreover, the number of error bits is input to the restore controller, and an internal read command PREAD and an update write command PWRITE are generated through a comparison operation.

For the above-described operation, the restore controller has an error discriminator 510 and an internal command generator 520.

The number of error bits is applied to the error discriminator 510 from the error correction decoder. The error discriminator 510 has the reference number of error bits set in advance, and the reference number of error bits may be input through an external terminal or have a fixed value through internal fuse working, for example. In the error discriminator 510, the number of error bits is compared with the reference number of error bits. The result of the comparison is output as a timing control signal and a write control signal.

The internal command generator 520 has a read command generation unit 521 and a write command generation unit 522. The read command generation unit 521 generates an internal read command PREAD under the control of a timing control signal, and the write command generation unit 522 generates an update write command PWRITE under the control of a write control signal.

For the above-described operation, the internal command generator 520 is connected to the error discriminator 510.

The timing control signal and the write control signal are generated by the comparison operation in the error discriminator 510. The timing control signal is input to the read command generation unit 521 to adjust the time at which the internal read command PREAD is activated. The read operation on the cells is the process where the designated address is input and the internal read command PREAD is applied to allow data from the corresponding cells to be input to the read path. Moreover, it includes an error correction decoding operation on the read code word.

The internal read command PREAD is in the form of a pulse wave, and the read operation is initiated at either the rising edge or falling edge of the waveform. The case where a pulse wave is generated is defined as the activation operation on the internal read command PREAD. In the present inventive concept, a read operation period refers to the interval between the time at which the internal read command PREAD is activated for the read operation on the designated address and the time at which the internal read command PREAD for the next address is generated.

If the number of error bits is greater than or equal to the reference number of error bits, the timing control signal sets the operation period of the internal read command PREAD to T1. Whereas, if the number of error bits is less than the reference number of error bits, the timing control signal sets the operation period of the internal read command PREAD to T2. The operation period T1 is set longer than operation period T2. As a result, the designated address having the number of error bits greater than or equal to a specific value is maintained for a longer operation time compared to cases where it is not true.

The write control signal is input to the write command generation unit 522, and the update write command PWRITE is selectively activated according to the write control signal.

If the number of error bits is less than the reference number of error bits, the update write command PWRITE is deactivated through the write control signal. However, if the number of error bits is greater than or equal to the reference number of error bits, the update write command PWRITE is activated through the write control signal.

Moreover, the read command generation unit 521 counts the number of occurrences of the internal read command PREAD generated after the activation of the restore command, and if the counting number reaches a specific value, recognizes it as the last address to stop the generation of the internal read command PREAD. In addition, the recognition of the last address may also be performed by the address generator of FIG. 5. For example, the address generator may compare the last address with the generated designated address, and if the last address and the designated address are the same, stop the generation of the next designated address.

Figure 7:
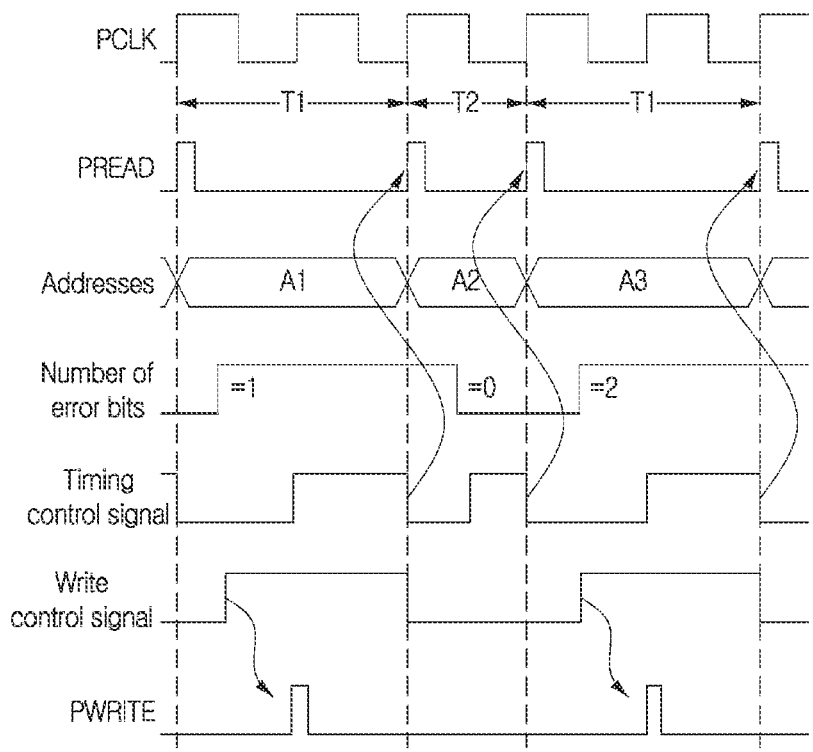
FIG. 7 is a timing diagram illustrating the operation of the restore controller of FIG. 6 according to a preferred embodiment of the present inventive concept.

FIG. 7 is a timing diagram illustrating the operation of the restore controller of FIG. 6 according to a preferred embodiment of the present inventive concept.

Referring to FIGS. 6 and 7, it is assumed that the number of error bits of a first code word stored in cells of a first address A1 is 1 and the number of error bits of a second code word stored in cells of a second address A2 is 0. Moreover, it is assumed that the number of error bits of a third code word stored in cells of a third address A3 is 2.

In synchronization with an internal clock PCLK, the internal read command PREAD is activated. The read operation normally starts at either the rising edge or falling edge of the internal read command PREAD. It is assumed that the internal read command PREAD is in the form of a pulse and is generated as a pulse signal at the falling edge of the timing control signal.

The first code word of the first address A1 is output, and the generated first number of error bits has a value of 1. The first number of error bits is compared with the reference number of error bits. It is assumed that the reference number of error bits has a value of 1.

The first number of error bits is greater than or equal to the reference number of error bits, and the timing control signal is set to a high level during one cycle of the internal clock PCLK and then goes down after one cycle has elapsed. Since it has been assumed that the internal read command PREAD is activated in the form of a pulse at the falling edge of the timing control signal, the internal read command PREAD has a first operation period T1.

The write control signal is activated by the comparison operation. It is assumed that the update write command PWRITE is activated at the rising edge of the write control signal. The update write command PWRITE is in the form of a pulse, and the write operation through the write path is initiated at either the rising edge or falling edge of the update write command PWRITE. The write control signal rises to a high level by the comparison operation of the number of error bits, and the update write command PWRITE is activated at the rising edge of the write control signal to start the write operation.

The read operation on the first address A1 is performed during the first operation period T1, and the update write command PWRITE is also activated within this operation period.

At the falling edge of the timing control signal, a new internal read command PREAD is generated, and the second address A2 is designated by the generated internal read command PREAD.

The second code word of the second address A2 has no error bits. The timing control signal generated by the comparison operation in the error discriminator has a second operation period T2 that is shorter than the first operation period T1 during which the first address A1 is generated. At the falling edge of the timing control signal at which the second operation period T2 is terminated, a new internal read command PREAD is activated to generate a pulse.

In the second operation period T2 during which the second address A2 is generated, the write control signal is maintained at a low level by the comparison operation. That is, the write control signal does not activate the update write command PWRITE during the second operation period T2.

If the second operation period T2 is terminated, a new internal read command PREAD is generated at the falling edge of the timing control signal, a new third address A3 is generated, and the read operation is initiated. Since the third code word assigned to the third address A3 has two error bits, the timing control signal controls the internal read command PREAD to have the operation period of the first operation period T1 through the read command generation unit 521. Furthermore, by the comparison operation of the error discriminator 510, the write control signal activates the update write command PWRITE through the write command generation unit 522.

In FIG. 7, if the reference number of error bits has a value of 2, the number of error bits of the first address A1 is smaller than the reference number of error bits, and thus the update write command is not activated like the second address A2.

If the number of error bits is greater than or equal to the reference number of error bits through the above-described operation, the timing control signal for controlling the read command generation unit 521 sets the first operation period T1 during which the internal read command PREAD operates. The first operation period T1 is set longer than the second operation period T2 which is set if the number of error bits is less than the reference number of error bits. The update write command PWRITE is activated within the first operation period T1. On the contrary, the update write command PWRITE is not activated within the second operation period T2.

In FIG. 7, the waveforms of the timing control signal and the write control signal are only examples for the generation of the internal read command PREAD and update write command PWRITE. When the timing control signal generates the internal read command PREAD, other types of waveforms may be generated as long as different operation periods can be generated depending on the comparison result of the number of error bits. Furthermore, any configuration can be used as long as the write control signal can selectively generate the update write command PWRITE depending on the comparison result of the number of error bits.

Figure 8:
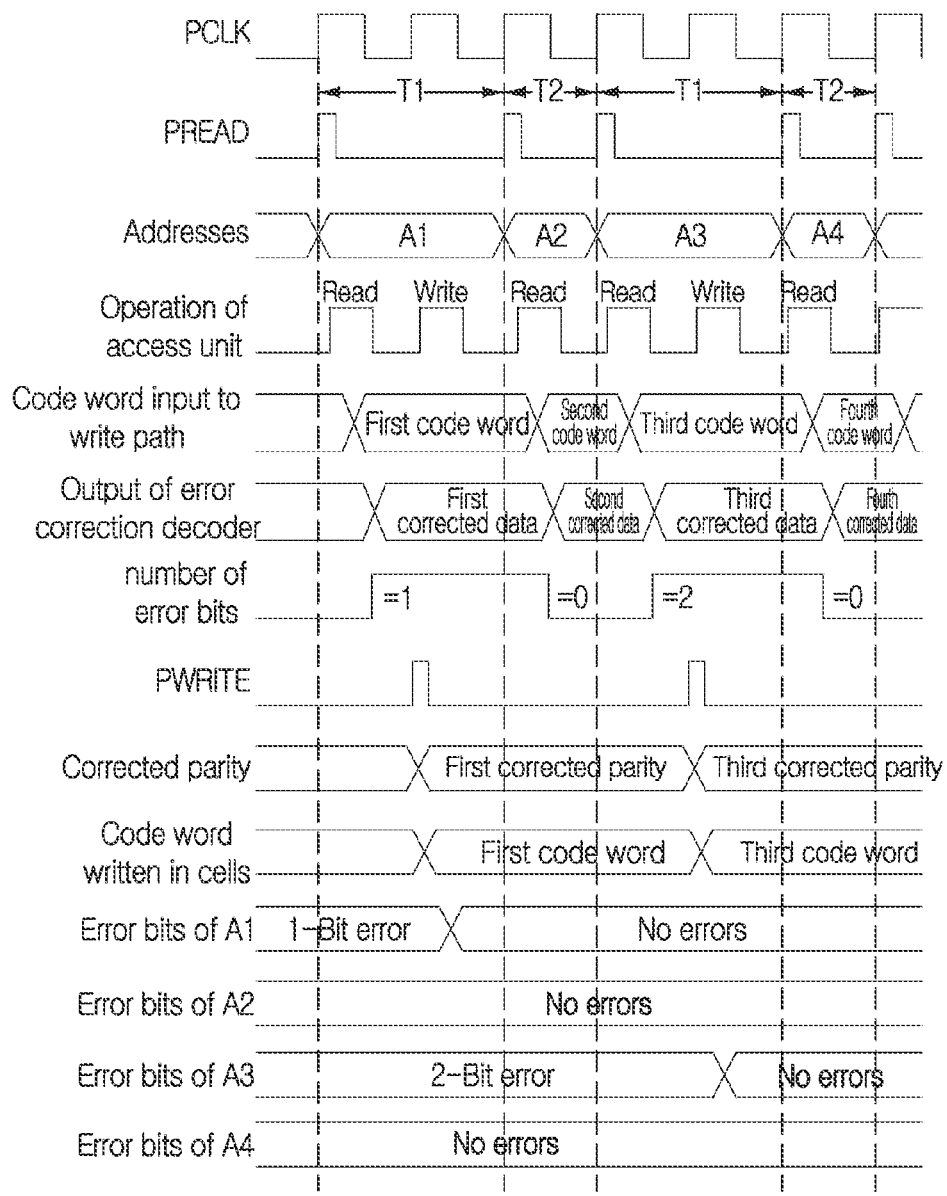
FIG. 8 is a timing diagram illustrating the operation of the memory of the present inventive concept according to a preferred embodiment of the present inventive concept.

FIG. 8 is a timing diagram illustrating the operation of the memory of the present inventive concept according to a preferred embodiment of the present inventive concept.

Referring to FIGS. 5 and 8, the restore command is input to the restore controller. The restore controller 500 receiving the restore command is activated to activate the internal read command PREAD. The generated internal read command PREAD is input to the address generator 600 to activate the read path 300.

The address generator 600 sequentially generates designated addresses A1, A2, A3, and A4 in response to the input internal read command PREAD. According to an embodiment, the start address may be input to the address generator 600 from the outside of the memory. However, the activation periods of the generated designated addresses may have different values. That is, if the update operation on the code word assigned to the designated address is performed, the period during which the corresponding designated address is supplied has the first operation period T1, and if the update operation is not performed, the period during which the designated address is supplied has the second operation period T2 that is shorter than the operation period T1.

In this embodiment, for the convenience of description, it is assumed that the number of error bits of the first code word assigned to the first address A1 is 1, the number of error bits of the second code word assigned to the second address A2 is 0, the number of error bits of the third code word assigned to the third address A3 is 2, and the number of error bits of the fourth code word assigned to the fourth address A4 is 1. Moreover, it is assumed that the reference number of error bits designated in the restore controller 500 is 1.

If the internal read command PREAD is activated and the first address A1 is generated, the access unit 200 outputs the first code word stored in the first address A1. The first code word output from the access unit 200 is input to the read path 300 activated by the internal read command PREAD. The first code word consists of first data and a first parity.

The error correction decoder 330 of the read path 300 performs the correction operation on the first data using the first parity and generates a first number of error bits that is the number of error bits of the first code word. Thus, the error correction decoder 330 outputs the first corrected data and the first number of error bits. The first corrected data is input to the output data register 340, and the first number of error bits is input to the restore controller 500.

The restore controller 500 performs the comparison operation between the first number of error bits and the reference number of error bits. Since the first number of error bits having a value of 1 is greater than or equal to the reference number of error bits having a value of 1, the internal write command PWRITE is activated. The write path 400 is activated by the internal write command PWRITE, a new first corrected parity corresponding to the first corrected data is generated in the write path 400, and a corrected code word consisting of the first corrected data and the first corrected parity is written in the cells of the first address, allowing for the update operation on the code word. In the above-described operation, the first corrected data selected by the write path 400 may be directly input from the error correction decoder 330.

Moreover, the restore controller 500 delays the time at which the new internal read command PREAD is generated through the comparison operation, continues to output the first address A1 for the delayed time, and reactivates the internal read command after the delay time has elapsed. That is, if the internal read command PWRITE is activated by the comparison operation, the first address A1 is supplied to the access unit 200 until the internal write operation is completed. The time at which the new internal read command PREAD is reactivated is delayed to maintain the first address A1, and the period during which the first address A1 is supplied becomes the first operation period T1.

After the first address A1 is supplied during the first operation period T1, a new internal read command PREAD is activated, and the address generator 600 generates a second address A2 by the new internal read command PREAD. Preferably, the second address A2 successively follows the first address A1. The second address A2 is applied to the access unit 200, and the read operation is initiated.

It has been assumed that the second code word stored in the cells of the second address has no number of error bits. Through the read operation, the second code word is input to the read path 300. The error correction decoding operation on the second code word is performed in the read path 300. The error correction decoder 330 determines the number of error bits of the second code word using the second parity and performs the error correction operation on the second data. Since it has been assumed that the number of error bits of the second code word is 0, a second number of error bits is 0, and the second corrected data is the same as the second data.

The second number of error bits is compared with the reference number of error bits, and the update write command PWRITE is deactivated. Accordingly, the write path 400 does not select the second corrected data, and the write operation on the second corrected data is not performed. Therefore, it is necessary to stop the read operation on the cells of the second address A2 and to perform the read operation on the new third address A3. To this end, the restore controller generates a new internal read command PREAD to have a second operation period T2 that is shorter than the first operation period T1.

That is, after the internal read command PREAD for supplying the second address A2 is generated, the operation period during which a new internal read command PREAD for designating a new address is generated is set to T2.

The address generator 600 receiving the newly generated internal read command PREAD generates a third address A3. The generated third address A3 is applied to the access unit 200. It has been assumed that the third code word stored in the cells corresponding to the third address A3 has the number of error bits of 2 bits.

The third code word output from the third address A3 of the cell array 100 through the access unit 200 is input to the read path 300. The error correction decoder 330 of the read path 300 corrects the third data using the third parity of the third code word. This results in the generation of third corrected data. Moreover, the number of error bits of the third code word is generated through the third parity. The number of error bits formed has a value of 2.

The number of error bits generated in the read path 300 is input to the restore controller 500 and compared with the reference number of error bits. Since the number of error bits has a value greater than or equal to the reference number of error bits, a new internal read command PREAD is generated after the first operation period T1 has elapsed. For example, the interval between the time at when the internal read command PREAD used for the generation of the third address A3 is activated and the time at which the internal read command PREAD for the generation of the next address is activated has a value of the first operation period T1. As a result, the time required for performing the update operation on the third code word is secured.

Furthermore, the restore controller 500 activates the update write command PWRITE. The restore controller 500 outputs the update write command PWRITE, and the write path 400 selects the third corrected data in response to the update write command PWRITE. The third corrected data input to the write path 400 is input to the error correction encoder 430, and the error correction encoder 430 generates a third corrected parity corresponding to the third corrected data. The third corrected data and the third corrected parity form a third corrected code word.

The third corrected code word is written in the cells of the third address A3 through the column decoder 220 of the access unit 200. As a result, the information of the cells corresponding to the third address A3 is updated or restored.

After the internal read command PWRITE is activated, a new internal read command PREAD is activated in the restore controller 500, and the address generator 600 receiving the internal read command PREAD generates a fourth address A4. The generated fourth address A4 is applied to the access unit 200, allowing for the read operation.

Since it has been assumed that the fourth code word assigned to the fourth address A4 has no error bits, the read operation and the data processing thereof are the same as those for the second address A2.

It is shown in FIGS. 7 and 8 that the period T2 is shorter than the period T1. This is because only the read operation is performed in the period T2. However, even if only the read operation is performed in the period T2 according to an embodiment, the period T2 may be set to have the same time interval as the period T1.

In this embodiment, the restore controller 500 is activated by the restore command. During the operation period of the restore controller 500, the comparison operation on the number of error bits is performed, and the internal read command PREAD or the internal write command PWRITE is generated. In particular, since the restore controller 500 activated by the restore command controls the update operation on information on the memory cell, a separate read command is not applied from the outside. Moreover, a plurality of addresses may be sequentially generated by a single restore command. The code words assigned to the plurality of addresses may be updated by application of a single restore command.

In this embodiment, the update or restore operation on the code word is selectively performed. That is, the number of error bits in the code word is determined based on the parity, and the number of error bits is compared with the reference number of error bits. The update operation is performed on the code word having the number of error bits that is greater than or equal to the reference number of error bits, while the update operation is not performed on the code word having the number of error bits that is less than the reference number of error bits.

The write operation is performed on the cells of the address where the update operation is performed. To this end, the update write command PWRITE is used, which is not a command applied from the outside of the memory, but an internal command generated within the memory. The update write command PWRITE is generated by the comparison of the number of error bits with the reference number of error bits. If the number of error bits is greater than or equal to the reference number of error bits, the update write command PWRITE is activated. That is, the write operation is not uniformly performed for all addresses, and it is determined based on the number of error bits of the code word. This means that the read operation and the write operation for one address do not necessarily need to be performed as a single set, but can be selectively performed.

The update operation or the restore operation on the code word consists of the read operation and the write operation on the corresponding address. The update operation does not uniformly occur for all addresses, but can be selectively performed depending on the number of error bits. If the number of error bits determined through the read operation on the code word of the address is less than the reference number of error bits, only the read operation is performed and the write operation is not performed. That is, the update operation on the code word is not performed.

For the selective update operation, the operation period of the internal read command PREAD does not have one value, but has two values. In this embodiment, the operation period of the internal read command PREAD is defined as the interval between the time at which the designated address is activated at either the rising edge or falling edge of a pulse-shaped waveform and the time at which a new internal read command PREAD pulse is generated for the generation of the next address. For the update operation, the internal read command PREAD has a first operation period T1, and if the update operation is not required, the internal read command PREAD has a second operation period T2. The first operation period T1 has a value greater than the second operation period T2, and the update write command PWRITE for the designated address is activated within the first operation period.

If the restore command is applied through the above-described operation, the memory sequentially generates the designated addresses and performs the read operation and the comparison operation on the generated designated addresses. The comparison operation is the process of comparing the number of error bits in the code word of the designated address with the reference number of error bits. Depending on the result of the comparison, the code word having the number of error bits that is greater than or equal to the reference number of error bits is updated and rewritten in the designated address through the write path. This process allows for the restore operation on the memory cell. Furthermore, the write operation is not performed on the code word having the number of error bits that is less than the reference number of error bits in the sequentially generated designated addresses. Thus, the restore operation on the memory can be effectively performed.

The invention claimed is:

1. A method for restoring data in a memory, comprising:
    generating a designated address in response to a restore command;
    performing a read operation on a code word having data and parity from cells of the designated address;
    comparing a number of error bits in the code word with a reference number of error bits; and
    performing a selective write operation on the designated address depending on the result of the comparison,
    wherein the read operation comprises:
        outputting the code word from the cells of the designated address in response to an internal read command; and
        determining the number of error bits and generating corrected data by performing error correction decoding on the code word,
    wherein the corrected data is generated by using the parity,
    wherein the comparing the number of error bits with the reference number of error bits comprises:
        if the number of error bits is greater than or equal to the reference number of error bits, activating an update write command to initiate the write operation on the corrected data, and generating a new internal read command after lapse of a first operation period from time at which the internal read command is activated, and
        if the number of error bits is less than or equal to the reference number of error bits, generating the new internal read command after lapse of a second operation period that is less than or equal to the first operation period from a time at which the internal read command is activated.

2. The method for restoring data in a memory of claim 1, wherein the new internal read command designates a new address.

3. The method for restoring data in a memory of claim 1, wherein the selective write operation comprises:
    inputting the corrected data to a write path in response to the update write command if the number of error bits is greater than or equal to the reference number of error bits; and
    deactivating the update write command if the number of error bits is less than or equal to the reference number of error bits.

4. The method for restoring data in a memory of claim 3, further comprising after inputting the corrected data to the write path:
    generating a corrected parity corresponding to the corrected data through error correction encoding; and
    writing a corrected code word consisting of the corrected data and the corrected parity in the cells of the designated address.

5. The method for restoring data in a memory of claim 1, further comprising determining whether the designated address is the last address after performing the selective write operation.

6. The method for restoring data in a memory of claim 5, wherein if the designated address is not the last address, a new address is designated.

7. A non-volatile memory comprising:
    a cell array with a plurality of cells disposed therein;
    an access unit that accesses the cell array to write or output a code word consisting of data and parity in or to cells assigned to a designated address;
    a read path that is connected to the access unit to generate corrected data by performing error correction on the data output from the cells in response to an internal read command and to generate a number of error bits in the code word using the parity;

a restore controller that receives the number of error bits from the read path and compares the number of error bits with a reference number of error bits to generate the internal read command or generate an update write command for a selective write operation in the cell array;

a write path that is connected to the access unit and disposed in parallel with the read path to selectively receive the corrected data in response to the update write command and generate a corrected parity to output a corrected code word to the access unit; and an address generator that receives the internal read command from the restore controller to generate the designated address.

8. The non-volatile memory of claim 7, wherein the read path comprises:

a read circuit for receiving and amplifying the code word of the designated address from the access unit; and an error correction decoder for generating the number of error bits and the corrected data in which the error bits are corrected through an error correction decoding operation on the code word amplified in the read circuit.

9. The non-volatile memory of claim 7, wherein if the number of error bits is greater than or equal to the reference number of error bits, the restore controller activates the update write command.

10. The non-volatile memory of claim 9, wherein the restore controller sets a first operation period during which the designated address is applied, and the update write command is activated within the first operation period.

11. The non-volatile memory of claim 10, wherein characterized in that after lapse of the first operation period, a new internal read command is generated, and the address generator designates a new address.

12. The non-volatile memory of claim 7, wherein the restore controller comprises:

an error discriminator for comparing the number of error bits with the reference number of error bits to generate a timing control signal and a write control signal; and an internal command generator for receiving the timing control signal to generate the internal read command and receiving the write control signal to generate the update write command.

13. The non-volatile memory of claim 12, wherein the internal command generator comprises:

a read command generation unit generating a new internal read command after lapse of a first operation period from time at which the internal read command is activated when the number of error bits is greater than or equal to the reference number of error bits, and generating the new internal read command after lapse of a second operation period that is less than or equal to the first operation period from the time at which the internal read command is activated when the number of error bits is less than or equal to the reference number of error bits; and a write command generation unit for receiving the write control signal, and activating the update write command when the number of error bits is greater than or equal to the reference number of error bits.

14. The non-volatile memory of claim 13, wherein activating the update write command is performed within the first operation period.

15. The non-volatile memory of claim 7, wherein the write path comprises:

a data selector for selectively receiving the corrected data in response to the update write command;

an error correction encoder for generating the corrected parity corresponding to the corrected data supplied from the data selector; and a write circuit for supplying a corrected code word consisting of the corrected data and the corrected parity to the access unit.

* * * * *